United States Patent  
Zhang et al.

(10) Patent No.: US 10,741,429 B2
(45) Date of Patent: Aug. 11, 2020

(54) MODEL-BASED CONTROL OF SUBSTRATE PROCESSING SYSTEMS

(71) Applicant: LAM RESEARCH CORPORATION, Fremont, CA (US)

(72) Inventors: Tao Zhang, San Ramon, CA (US); Kai Liu, Merced, CA (US); Eric Samulon, Oakland, CA (US)

(73) Assignee: Lam Research Corporation, Fremont, CA (US)

( * ) Notice: Subject to any disclaimer, the term of this patent is extended or adjusted under 35 U.S.C. 154(b) by 23 days.

(21) Appl. No.: 16/014,606

(22) Filed: Jun. 21, 2018

(65) Prior Publication Data

US 2019/0393059 A1    Dec. 26, 2019

(51) Int. Cl.
*H01L 21/67* (2006.01)
*G05B 19/418* (2006.01)

(52) U.S. Cl.
CPC .. *H01L 21/67253* (2013.01); *G05B 19/41885* (2013.01); *G05B 2219/41303* (2013.01);
(Continued)

(58) Field of Classification Search
CPC ........ H01L 21/67253; H01L 21/67248; G05B 19/41885; G05B 2219/41303;
(Continued)

(56) References Cited

U.S. PATENT DOCUMENTS 5,341,663 A * 8/1994 Knapp .................... B21B 37/16
700/122
7,376,472 B2 * 5/2008 Wojsznis ............... G05B 11/32
700/28
(Continued)

FOREIGN PATENT DOCUMENTS

JP    2009064814 A    3/2009
JP    2016012723 A    1/2016
(Continued)

OTHER PUBLICATIONS

International Search Report and Written Opinion for PCT Application No. PCT/US2019/037234 dated Oct. 4, 2019.

*Primary Examiner* — Rocio Del Mar Perez-Velez
*Assistant Examiner* — Alicia M. Choi

(57) ABSTRACT

A system for controlling a parameter of a plant associated with a substrate processing chamber is disclosed. A measuring circuit measures a response of the plant associated with the substrate processing chamber when the parameter of the plant is changed. A model generating circuit determines a delay and a gain of the plant based on the response. The model generating circuit generates a model of the plant based on the delay, the gain, and a time constant of the plant. A predicting circuit receives a set point for the parameter and a measurement of the parameter, generates a value of a prediction of the parameter based on the set point for the parameter and the measurement of the parameter using the model, wherein the value of the prediction of the parameter does not include the delay, compares the value of the prediction of the parameter with the set point to generate a control signal, and controls the parameter of the plant based on the control signal.

21 Claims, 8 Drawing Sheets

(52) U.S. Cl.
CPC .............. *G05B 2219/45031* (2013.01); *G05B 2219/49004* (2013.01)

(58) Field of Classification Search
CPC . G05B 2219/45031; G05B 2219/49004; F01P 7/167
USPC .......................................................... 700/97
See application file for complete search history.

(56) References Cited

U.S. PATENT DOCUMENTS

| | | | |
|---|---|---|---|
| 2009/0229641 A1* | 9/2009 | Yoshida .................... | B08B 3/00 134/107 |
| 2012/0170639 A1* | 7/2012 | Salsbury .............. | G05B 13/048 375/233 |
| 2015/0107268 A1* | 4/2015 | Han ........................ | F25B 21/02 62/3.3 |
| 2018/0005857 A1 | 1/2018 | Zhang et al. | |
| 2018/0211891 A1* | 7/2018 | Veerasingam ...... | G06F 17/5081 |
| 2019/0084437 A1* | 3/2019 | Son ......................... | B60L 58/10 |

FOREIGN PATENT DOCUMENTS

| | | |
|---|---|---|
| KR | 20110054837 A | 5/2011 |
| WO | WO-2017192211 A1 | 11/2017 |

* cited by examiner

MODEL-BASED CONTROL OF SUBSTRATE PROCESSING SYSTEMS

FIELD

The present disclosure relates generally to holding devices using electrostatic attraction and more particularly to model-based control of substrate processing systems.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

A temperature of a substrate (e.g., a semiconductor wafer) in a processing chamber can be controlled in many ways. For example, one or more heaters can be arranged in a substrate support assembly, and the power supplied to the heaters can be controlled to control the temperature of the substrate. As another example, one or more fluids can be circulated through one or more flow passages arranged in the substrate support assembly using valves, and the temperature of the fluids can be used to control the temperature of the substrate.

SUMMARY

A system for controlling a parameter of a plant associated with a substrate processing chamber comprises a measuring module, a model generating module, and a predicting module. The measuring module is configured to measure a response of the plant associated with the substrate processing chamber when the parameter of the plant is changed. The model generating module is configured to determine a delay and a gain of the plant based on the response. The delay indicates time taken for the parameter to change after the plant receives a command to change the parameter. The gain indicates a relationship between the command and an amount of change in the parameter caused by the command. The model generating module is configured to generate a model of the plant based on the delay, the gain, and a time constant of the plant. The predicting module is configured to receive a set point for the parameter and a measurement of the parameter. The predicting module is configured to generate a prediction of a delay-free value of the parameter based on the set point for the parameter and the measurement of the parameter using the model. The predicting module is configured to compare the prediction with the set point to generate a control signal, and control the parameter of the plant based on the control signal.

In other features, the prediction decreases an overshoot and a rise time of the parameter in response to a change in the set point.

In other features, the substrate processing chamber includes a substrate support assembly supporting a substrate. The plant controls an operation of the substrate support assembly including controlling a temperature of the substrate.

In other features, the plant comprises first and second sources to supply a fluid at different temperatures. The plant comprises first and second three-way proportional valves to receive the fluid from the first and second sources and to mix portions of the received fluid to supply the fluid to the substrate support assembly at a first temperature and a first flow rate. The plant comprises a third three-way proportional valve to receive the fluid from the substrate support assembly at a second temperature and a second flow rate and to return the fluid received from the substrate support assembly to the first and second sources. The predicting module controls the first, second, and third three-way proportional valves according to the control signal.

In other features, the parameter includes at least one of the first temperature of the fluid supplied to the substrate support assembly, the second temperature of the fluid returned from the substrate support assembly, the first flow rate of the fluid supplied to the substrate support assembly, and the second flow rate of the fluid returned from the substrate support assembly.

In other features, the predicting module controls a temperature of the substrate based on the fluid supplied to the substrate support assembly according to the control signal.

In other features, the measuring module comprises a temperature sensor associated with a supply line that supplies the fluid from the first and second three-way proportional valves to the substrate support assembly. The measuring module comprises a flow meter associated with the supply line. The model generating module generates the model of the plant based on data received from the temperature sensor and the flow meter.

In other features, the measuring module comprises a temperature sensor associated with a return line that returns the fluid from the substrate support assembly to the third three-way proportional valve. The measuring module comprises a flow meter associated with the return line. The model generating module generates the model of the plant based on data received from the temperature sensor and the flow meter.

In other features, the first and second sources include level sensors to sense fluid levels of the first and second sources. The predicting module controls the third three-way proportional valve based on the fluid levels.

In other features, the third three-way proportional valve divides the fluid received from the substrate support assembly between the first and second sources to maintain fluid levels of the first and second sources between first and second thresholds.

In still other features, a method for controlling a parameter of a plant associated with a substrate processing chamber comprises measuring a response of the plant associated with the substrate processing chamber when the parameter of the plant is changed. The method further comprises determining a delay and a gain of the plant based on the response. The delay indicates time taken for the parameter to change after the plant receives a command to change the parameter. The gain indicates a relationship between the command and an amount of change in the parameter caused by the command. The method further comprises generating a model of the plant based on the delay, the gain, and a time constant of the plant. The method further comprises receiving a set point for the parameter and a measurement of the parameter. The method further comprises generating a prediction of a delay-free value of the parameter using the model. The method further comprises comparing the prediction with the set point to generate a control signal. The method further comprises controlling the parameter of the plant based on the control signal.

In other features, the prediction decreases an overshoot and a rise time of the parameter in response to a change in the set point.

In other features, the substrate processing chamber includes a substrate support assembly supporting a substrate. The method further comprises controlling an operation of the substrate support assembly including controlling a temperature of the substrate.

In other features, the method further comprises receiving, at first and second three-way proportional valves, a fluid having first and second temperatures from first and second sources. The method further comprises mixing, using the first and second three-way proportional valves, portions of the fluid received from the first and second sources. The method further comprises supplying the mixed portions of the fluid having a first temperature to the substrate support assembly at a first flow rate. The method further comprises receiving, at a third three-way proportional valve, fluid having at a second temperature from the substrate support assembly at a second flow rate. The method further comprises returning, using the third three-way proportional valve, the fluid received from the substrate support assembly to the first and second sources. The method further comprises controlling the first, second, and third three-way proportional valves according to the control signal.

In other features, the parameter includes at least one of the first temperature of the fluid supplied to the substrate support assembly, the second temperature of the fluid returned from the substrate support assembly, the first flow rate of the fluid supplied to the substrate support assembly, and the second flow rate of the fluid returned from the substrate support assembly.

In other features, the method further comprises controlling a temperature of the substrate based on the fluid supplied to the substrate support assembly according to the control signal.

In other features, the method further comprises sensing, using a temperature sensor, a temperature of the mixed portions of the fluid being supplied from the first and second three-way proportional valves to the substrate support assembly. The method further comprises measuring, using a flow meter, a flow rate of the mixed portions of the fluid flowing from the substrate support assembly to the third three-way proportional valve. The method further comprises generating the model of the plant based on the sensed temperature and the measured flow rate.

In other features, the method further comprises sensing, using a temperature sensor, a temperature of the fluid returned from the substrate support assembly to the third three-way proportional valve. The method further comprises measuring, using a flow meter, a flow rate of the fluid returned from the substrate support assembly to the third three-way proportional valve. The method further comprises generating the model of the plant based on the sensed temperature and the measured flow rate.

In other features, the method further comprises sensing, using level sensors, fluid levels of the first and second sources. The method further comprises controlling the third three-way proportional valve based on the fluid levels.

In other features, the method further comprises dividing the fluid received from the substrate support assembly between the first and second sources to maintain fluid levels of the first and second sources between first and second thresholds.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Figure 1:
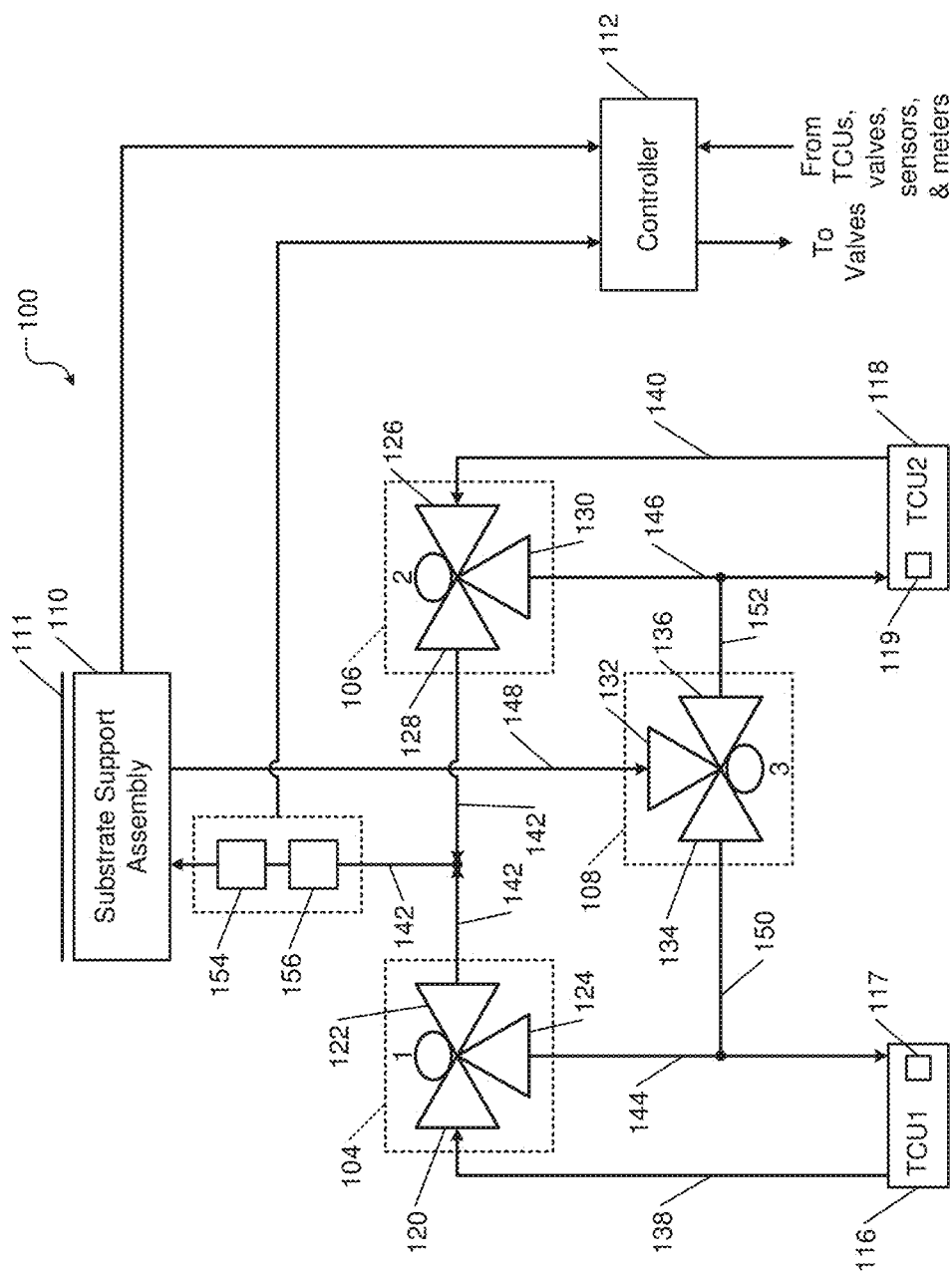
FIG. 1 shows a schematic of a system comprising three three-way proportional valves and two temperature control units (TCUs) to control a temperature of a substrate in a processing chamber.

Fluids such as coolants can be used to regulate a temperature of a substrate arranged on a substrate support assembly (e.g., an electrostatic chuck or ESC) in a processing chamber. In such a system, the quality of etching the substrate depends on controlling the temperature and flow rate of the coolant. Various factors can affect the processes that control the temperature and flow rate of the coolant. These factors include time delays associated with actuators, sensors, etc. of the system; and disturbances associated with the system including those arising from fluctuations in temperature and flow rate of the coolant supplied by temperature control units (TCUs); disturbances from plasma heating; etc. Due to these factors, maintaining the temperature of the substrate within a set point range can be problematic. Small disturbances or set point changes can introduce large overshoots or oscillations in the coolant supply temperature and/or coolant flow rate, which may affect etching uniformity of the substrate. In some systems, meeting rise time requirements for the coolant supply temperature using conventional proportional integral derivative (PID) controllers can be challenging. Moreover, standard PID controllers, which are widely used for temperature control in plasma etching systems, provide limited disturbance rejection. Thus, standard PID controllers have difficulty in handling disturbances and controlling substrate temperature and other plant parameters associated with substrate processing when the plant delays are long.

The present disclosure proposes using a plant model and Smith predictor, which is a type of predictive controller for systems with large time delays, to control one or more parameters associated with a plant (e.g., coolant supply temperature, coolant flow rate, etc.). The plant model can be estimated based on a control system used to control a plant parameter (e.g., the coolant supply temperature). Based on the plant model, Smith predictor can be used to control the plant parameter. The systems and methods of the present disclosure use predicted control signals generated based on the plant model and Smith predictor to control the system (e.g., control the substrate temperature) instead of waiting for feedback to control the system. The proposed model based Smith predictor control improves the system response. Specifically, the rise time of the controlled parameter is decreased, and disturbances are compensated to minimize overshoots in the controlled parameter. The systems and methods of the present disclosure can estimate a highly accurate plant model, which increases the efficacy of the Smith predictor.

Throughout the present disclosure, systems and methods are described for controlling the coolant supply temperature for example only. The systems and methods can be used to control any plant parameter (e.g., flow rate of the coolant, temperature of the coolant returned from the substrate support assembly (coolant return temperature), and so on). Further, while an example of a plant including a substrate support assembly, two TCUs, and three valves is shown and described herein, the teachings of the present disclosure can be applied to any plant associated with a substrate processing system involving long delays.

The present disclosure is organized as follows. An example of a plant is initially described with reference to FIGS. 1 and 2. A controller that generates a model of the plant is described with reference to FIGS. 3A and 3B. A control system that controls the plant using the plant model and Smith predictor is described with reference to FIGS. 4A, 4B, and 5. Examples of substrate processing systems that can utilize the control system of the present disclosure to control process parameters are described with reference to FIGS. 6 and 7.

Figure 6:
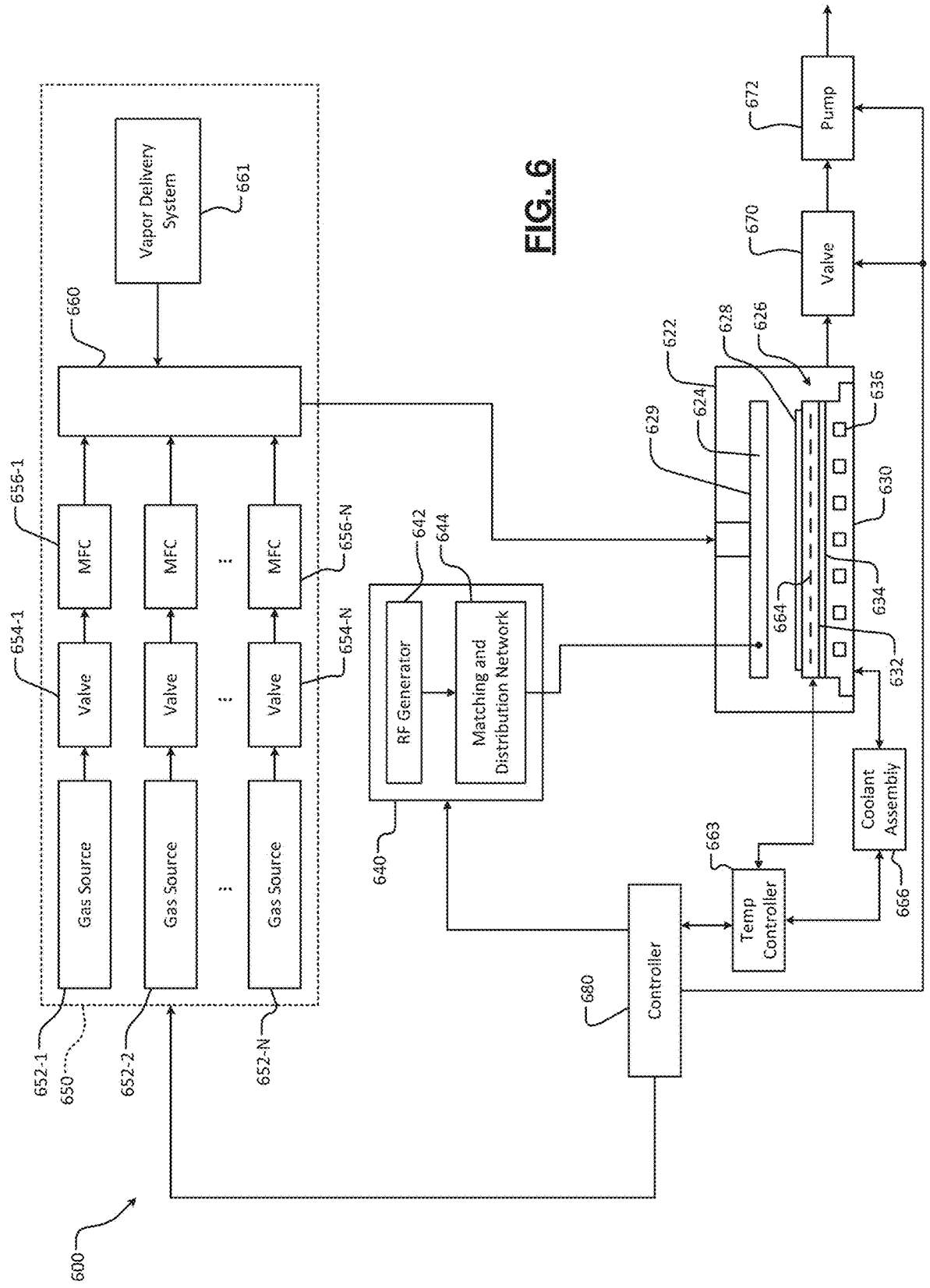
FIG. 6 is a functional block diagram of one example of a substrate processing system that can use the controller to control process parameters of the substrate processing system.
Figure 7:
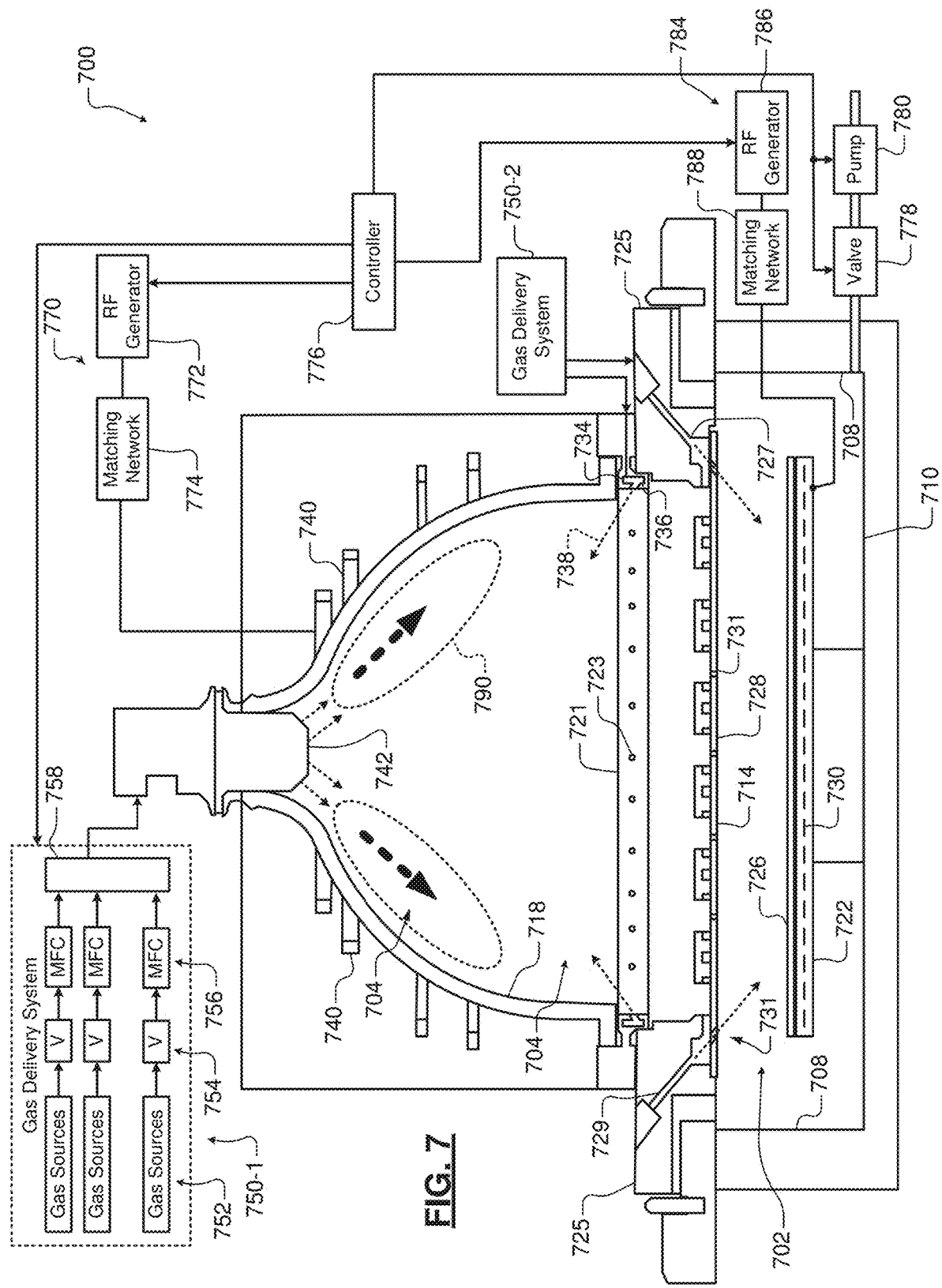
FIG. 7 is a functional block diagram of another example of a substrate processing system that can use the controller to control process parameters of the substrate processing system.

FIG. 1 shows an example of a plant or a system 100 for controlling the temperature of a substrate 111 arranged on a substrate support assembly 110 in a processing chamber (examples shown in FIGS. 6 and 7). Before describing the system 100 in detail, a brief overview of the system 100 is presented. The system 100 uses two three-way proportional valves that allow controlled mixing of hot and cold coolant from two TCUs. The mixed coolant is supplied to the substrate support assembly at a desired temperature and at a desired flow rate to control the temperature of the substrate within a desired set point range. The system 100 uses a third three-way proportional valve that divides the flow of coolant returned from the substrate support assembly to each TCU to prevent under- and overfilled conditions from occurring in the TCUs.

A temperature sensor (e.g., a thermocouple (TC)) is associated with (i.e., coupled to) a supply line supplying the mixed coolant to the substrate support assembly. The temperature sensor senses the temperature of the coolant being supplied to the substrate support assembly. A flow meter associated with (i.e., coupled to) the supply line measures the flow rate of the coolant being supplied to the substrate support assembly. The two mixing valves utilize the thermocouple and the flow meter and a PID control to regulate their position while the third valve uses feedback from level sensors in the TCUs and the PID control to regulate its position.

As shown in FIG. 1, the system 100 comprises a first three-way proportional valve (hereinafter first valve) 104, a second three-way proportional valve (hereinafter second valve) 106, a third three-way proportional valve (hereinafter third valve) 108, the substrate support assembly 110, a controller 112, and first and second TCUs (coolant sources) 116 and 118. The first TCU 116 supplies a coolant at a first temperature. The second TCU 118 supplies the coolant at a second temperature.

In some implementations, the flow rate of each of the first and second TCUs 116, 118 may need to be fixed. In some implementations, the flow rates of the first and second TCUs 116, 118 may be different although the flow rates may be fixed. For example, the first TCU 116 may have a first fixed flow rate, and the second TCU 118 may have a second fixed flow rate. In any of these implementations, the fixed flow rate or flow rates of the first and second TCUs 116, 118 need not be varied during operation to adjust the amount of coolant supplied by each of first and second TCUs 116, 118.

The system 100 controls the temperature of the substrate 111 as follows.

The first valve 104 has an input port 120, a first output port 122, and a second output port (or bypass) 124. The second valve 106 has an input port 126, a first output port 128, and a second output port (or bypass) 130. The third valve 108 has an input port 132, a first output port 134, and a second output port 136.

The input port 120 of the first valve 104 receives the coolant at the first temperature from the first TCU 116 at a fixed flow rate via a first fluid line 138. The input port 126 of the second valve 106 receives the coolant at the second temperature from the second TCU 118 at the fixed flow rate via a second fluid line 140.

The first output port 122 of the first valve 104 outputs a first portion of the coolant received from the first TCU 116 into a supply line 142. The first output port 128 of the second valve 106 outputs a first portion of the coolant received from the second TCU 118 into the supply line 142. The first portions of the coolant output from the respective first output ports 122, 128 of the first and second valves 104, 106 are mixed in the supply line 142.

The mixed coolant in the supply line 142 is supplied to the substrate support assembly 110. The mixed coolant may be supplied to one or more flow passages (not shown) arranged in the substrate support assembly 110 to control the temperature of the substrate 111 arranged on the substrate support assembly 110.

The controller 112 controls the first and second valves 104, 106 and determines the amounts of the first portions of the coolant that are output from the respective first output ports 122, 128 of the first and second valves 104, 106. The controller 112 controls the first and second valves 104, 106 and determines the amounts based on a desired temperature (e.g., a predetermined temperature or a set point) at which the coolant is to be supplied via the supply line 142 to the substrate support assembly 110 to control the substrate temperature. The first portions of the coolant that are output from the respective first output ports 122, 128 of the first and second valves 104, 106 are mixed in the supply line 142, and the resulting mixed coolant having the desired temperature is supplied via the supply line 142 to the substrate support assembly 110 at a desired flow rate (e.g., a predetermined flow rate).

A second portion of the coolant received by the first valve 104 from the first TCU 116 may not be needed to mix with the first portion of the coolant received by the second valve 106 from the second TCU 118 to supply the coolant at the desired temperature and at the desired flow rate to the substrate support assembly 110. The second portion of the coolant received by the first valve 104 from the first TCU 116 that is not output from the first output port 122 of the first valve 104 into the supply line 142 is returned to the first TCU 116 via the second output port (or bypass) 124 of the first valve 104 and via a fluid line 144.

A second portion of the coolant received by the second valve 106 from the second TCU 118 may not be needed to mix with the first portion of the coolant received by the first valve 104 from the first TCU 116 to supply the coolant at the desired temperature and at the desired flow rate to the substrate support assembly 110. The second portion of the coolant received by the second valve 106 from the second TCU 118 that is not output from the first output port 128 of the second valve 106 into the supply line 142 is returned to the second TCU 118 via the second output port (or bypass) 130 of the second valve 106 and via a fluid line 146.

Since the unused portions (i.e. the second portions) of the coolant received by the first and second valves 104, 106 are returned to the first and second TCUs 116, 118, the first and second TCUs 116, 118 can supply the coolant to the first and second valves 104, 106 at a fixed flow rate. This simplifies the design of the first and second TCUs 116, 118. For example, a pump (not shown) used to pump the coolant from the first and second TCUs 116, 118 to the first and second valves 104, 106 can be operated at a single speed. Further, the first and second temperatures of the coolant in the first and second first and second TCUs 116, 118 can be easily maintained.

The coolant returned from the substrate support assembly 110 is received by the third valve 108 via a return line 148. The input port 132 of the third valve 108 receives the coolant from the substrate support assembly 110 via the return line 148. The third valve 108 divides the returned coolant between the first and second TCUs 116, 118. A first portion of the coolant received by the third valve 108 from the substrate support assembly 110 is returned to the first TCU 116 via the first output port 134 of the third valve 108 through a fluid line 150 and the fluid line 144. A second portion of the coolant received by the third valve 108 from the substrate support assembly 110 is returned to the second TCU 118 via the second output port 136 of the third valve 108 through a fluid line 152 and the fluid line 146.

The controller 112 controls the third valve 108 and determines the appropriate or desired amounts of the first and second portions of the coolant that are output from the first and second output ports 134, 136 of the third valve 108 to the first and second TCUs 116, 118, respectively. For example, the controller 112 monitors the level of the coolant in the first and second TCUs 116, 118 based on data received from level sensors 117, 119 in the first and second TCUs 116, 118. Accordingly, the controller 112 determines the level of the coolant in each of the first and second TCUs 116, 118 and determines the amounts of the first and second portions of the coolant to return to the first and second TCUs 116, 118.

It is desirable to have sufficient coolant in each of the first and second TCUs 116, 118. For example, it may be desirable that the amount of coolant in each of the first and second TCUs 116, 118 is not less than or equal to a first threshold and not greater than or equal to a second threshold. The first threshold may be a minimum allowable low level of coolant to prevent an under-filled condition in each of the first and second TCUs 116, 118. The second threshold may be a maximum allowable high level of coolant to prevent an overfilled condition in each of the first and second TCUs 116, 118.

Accordingly, the controller 112 controls the first and second output ports 134, 136 of the third valve 108 such that the first and second portions of the coolant that are output from the first and second output ports 134, 136 to the first and second TCUs 116, 118 maintain the coolant level in each of the first and second TCUs 116, 118 between the first and second thresholds. For example, the controller 112 controls the first and second output ports 134, 136 of the third valve 108 and determines the first and second portions of the coolant to output from the first and second output ports 134, 136 to the first and second TCUs 116, 118 based on feedback from the level sensors 117, 119 regarding the level of the coolant in each of the first and second TCUs 116, 118 so as to maintain the coolant level in each of the first and second TCUs 116, 118 between the first and second thresholds. Thus, the controller 112 controls (i.e., regulates the position of) the third valve 108 based on data received from level sensors 117, 119 in the first and second TCUs 116, 118 in order to prevent an under- and overfilled conditions from occurring in each of the first and second TCUs 116, 118.

The system 100 further comprises a temperature sensor (e.g., a thermocouple) 154 and a flow meter 156 associated with (i.e., coupled to) the supply line 142. The temperature sensor 154 senses the temperature of the coolant supplied to the substrate support assembly 110 through the supply line 142. The flow meter 156 measures the flow rate of the coolant supplied to the substrate support assembly 110 through the supply line 142. While not shown, similar sensor and meter can be coupled to the return line 148 to measure the temperature and the flow rate of the coolant returned from the substrate support assembly 110 through the return line 148.

The controller 112 comprises a proportional integral derivative (PID) controller. The controller 112 controls the amount of coolant supplied by the first and second valves 104, 106 based on the desired temperature at which the coolant is to be supplied to the substrate support assembly 110 and the temperature of the coolant sensed by the temperature sensor 154. Accordingly, the controller 112 controls the respective first output ports 122, 128 of the first and second valves 104, 106 based on the desired temperature at which the coolant is to be supplied to the substrate support assembly 110 and the temperature of the coolant sensed by the temperature sensor 154.

Additionally, the controller 112 controls the amount of coolant supplied by the first and second valves 104, 106 based on the desired flow rate at which the coolant is to be supplied to the substrate support assembly 110 and the flow rate of the coolant sensed by the flow meter 156. Accordingly, the controller 112 controls the respective first output ports 122, 128 of the first and second valves 104, 106 based on the desired flow rate at which the coolant is to be supplied to the substrate support assembly 110 and the flow rate of the coolant measured by the flow meter 156. Thus, the controller 112 controls (i.e., regulates the position of) the first and second valves 104, 106 based on data received from the temperature sensor 154 and the flow meter 156.

Figure 2:
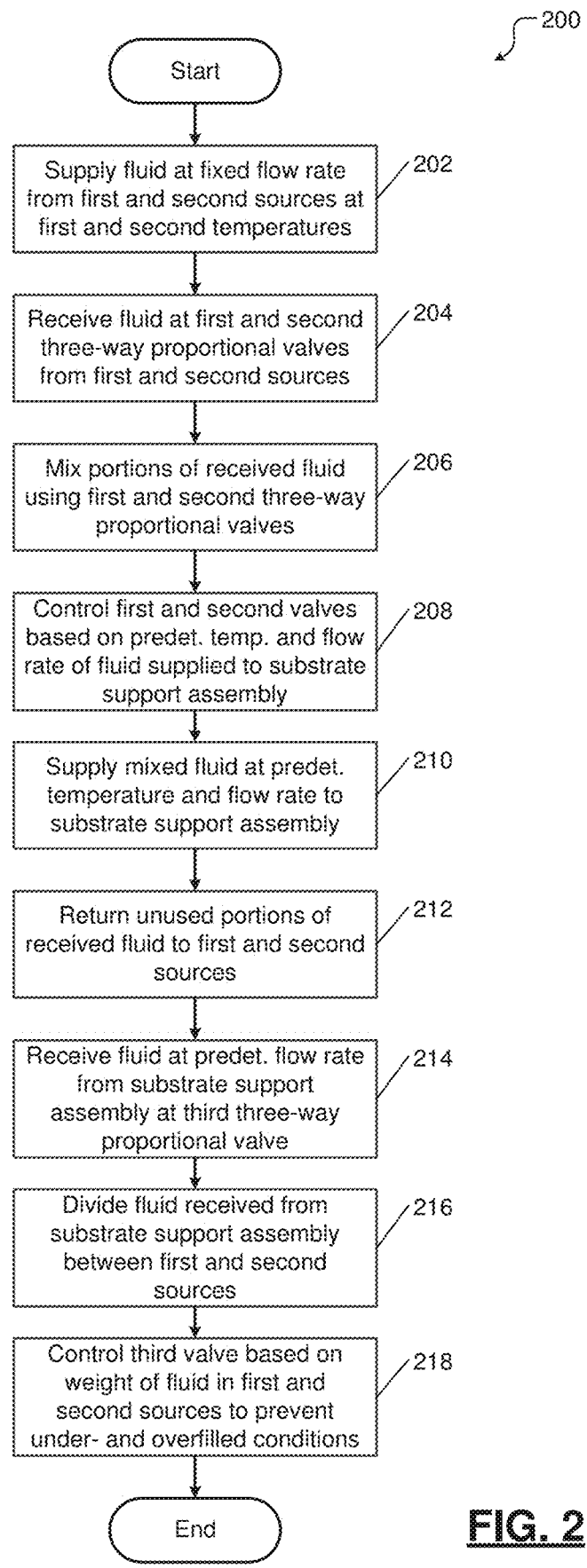
FIG. 2 shows a flowchart of a method for controlling a temperature of a substrate in a processing chamber using three three-way proportional valves and two TCUs of FIG. 1.

FIG. 2 shows a method 200 for controlling the temperature of a substrate (e.g., the substrate 111 shown in FIG. 1) arranged on a substrate support assembly (e.g., the substrate support assembly 110 shown in FIG. 1). For example, the method 200 is performed by the controller 112 shown in FIG. 1. At 202, a fluid (e.g., coolant) is supplied at a fixed flow rate from first and second fluid sources (e.g., the first and second TCUs 116, 118 shown in FIG. 1) at first and second temperatures, respectively. At 204, the fluid supplied at first and second temperatures by the first and second TCUs is received at first and second valves (e.g., the first and second valves 104, 106 shown in FIG. 1), respectively.

At 206, portions of the received fluid are mixed using the first and second valves. At 208, the amounts of the fluid received from the first and second TCUs that are mixed are determined by controlling the first and second valves based on the desired temperature and flow rate at which the fluid is to be supplied to the substrate support assembly to control the temperature of the substrate.

At 210, the mixed fluid at the desired temperature is supplied at the desired flow rate to the substrate support assembly for controlling temperature of the substrate. At 212, unused portions of the fluids received from the first and second TCUs are returned to the first and second TCUs using the first and second valves, respectively.

At 214, the fluid returned from the substrate support assembly is received at a third valve (e.g., the third valve 108 shown in FIG. 1). At 214, the fluid received from the substrate support assembly is divided between the first and second TCUs. At 216, the amounts of the fluid received from the substrate support assembly that are returned to the first and second TCUs are determined by controlling the third valve based on feedback from the level sensors regarding the level of the fluid present in the first and second TCUs, respectively. The amounts of the fluid received from the substrate support assembly are divided and returned to the first and second TCUs by controlling the third valve so that the fluid level in each of the first and second TCUs is maintained between a low and a high level threshold. This prevents under- and overfilled conditions from occurring in each of the first and second TCUs.

When a set point for the substrate temperature is changed, the controller 112 issues one or more commands or control signals to control one or more elements of the system 100 to effect the change. For example, the controller 112 sends control signals to the first and second valves 104, 106 that mix different amounts of coolant to change the substrate temperature. Further, the controller 112 receives signals or data from the flow meter 156 and the sensors 154, 117, 119 based on which the controller 112 controls the valves 104, 106, 108 to maintain the substrate temperature within a set point range.

There are various delays associated with the valves, meters, sensors, etc. controlled by the controller 112, collectively called a plant. In control theory, a plant is a combination of processes and actuators and is often referred to with a transfer function indicating a relationship between an input signal and an output signal of a system without feedback, commonly determined by physical properties of the system. For example, a delay can be between the time when the controller 112 issues a command or a control signal to change a position of a valve and the time it takes for the valve to actually change position. Additionally, there are delays between the time when a change occurs in a parameter (e.g., coolant temperature, coolant flow rate, etc.), the time a sensor or a meter takes to sense or measure the change, and the time when the controller 112 receives the data from the sensor or the meter to generate a command to respond to the change.

There can be various other delays. For example, there can be delays associated with coolant pressure stabilization, the time taken by the temperature of the mixed coolant to reach steady state, and so on. These delays can cause the controller 112 to overcompensate, which can result in overshoots and other undesirable effects that can adversely impact the etching uniformity of the substrate. As FIGS. 3A-5 show, the controller 112 generates a model of the system 100 that can be used with a predictor such as Smith predictor to control the substrate temperature with decreased overshoots and rise times as explained below.

Smith predictor is a model-based predictive controller that provides effective control for processes with long dead time or time delay. The Smith predictor includes an inner loop with a main controller that can be designed without the long dead time. Effects of load disturbances and plant modeling errors are corrected through an outer loop. The Smith predictor can also be used for processes with significant non-minimum phase dynamics and for higher order systems that exhibit apparent dead time.

In process control, the occurrence of dead time, transportation lag, or time delay is common. For most simple control loops, the amount of dead time is usually not significant when compared to a time constant of the plant. However, for more complicated control loops like those for quality control, the dead time can be significant and may even be longer than the system time constant. The reasons for this may include delay associated with analysis and down-stream locations of sampling points. Another class of examples is characterized by a multitude of small lags giving rise to what is called apparent dead time. Most PID controllers become ineffective when the process dead time becomes significant. Consequently, many control loops such as those for quality control are either poorly regulated or require manual intervention, which necessitates frequent and close attention of plant operators.

If major disturbances to a process can be measured, feedforward control can be an effective way to cope with the problem of long dead time. If the disturbances cannot be accurately measured and used in feedforward control, dead time compensation will have to be introduced if tight control is desired. The simplest dead time compensation method for a stable, well-damped process is the Smith predictor.

Figure 3B:
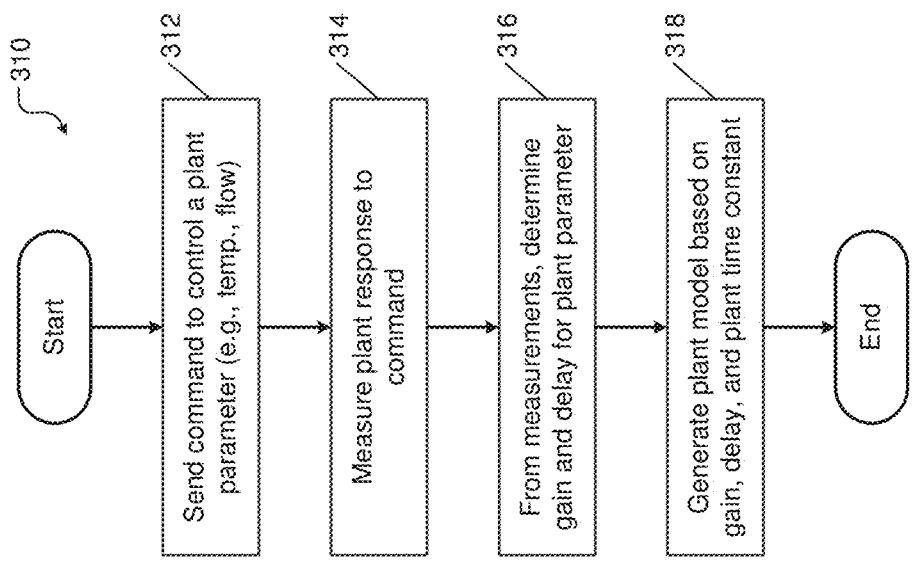
FIG. 3B shows a flowchart of a method performed by the controller of FIG. 3A to generate a plant model of the system of FIG. 1.
Figure 3A:
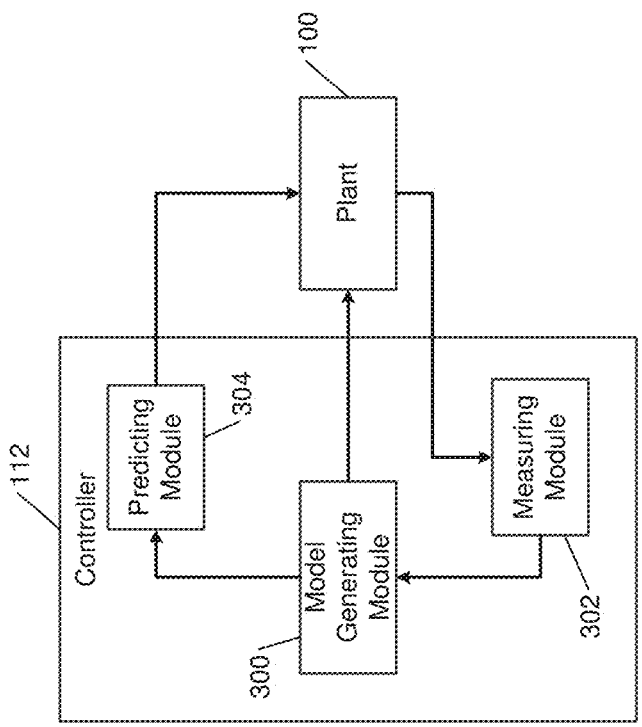
FIG. 3A shows a block diagram of a controller that generates a plant model of the system of FIG. 1.

As shown in FIGS. 3A and 3B, the controller 112 generates a plant model for the system 100 as follows. The controller 112 comprises a model generating module 300, a measuring module 302, and a predicting module 304. The controller 112 generates a plant model according to the method 310 and controls the plant 100 using the plant model and the predicting module 304 (e.g., a Smith predictor). The plant model has three parameters: a time delay, a time constant, and a gain or sensitivity (a relationship between input (command) and output (system response)) of the plant. The controller 112 generates the plant model by executing the method 310 as follows.

At 310, the model generating module 300 send commands to one or more components (e.g., to one or more valves 104, 106, 108) of the plant to control a plant parameter (e.g., coolant supply temperature, coolant supply flow, etc.). At 312, the measuring module 302 receives data from one or more sensors and meters of the system 100 (e.g., elements 154, 156, 117, 119, a temperature sensor in the substrate support assembly 110, etc.). The data represents the response of the system 100 to the command.

At 314, the model generating module 300 determines a delay and a gain of the plant based on the response. The delay indicates a time taken for the parameter to change after the plant receives the command to change the parameter. The gain indicates a relationship between the command (e.g., a value, amplitude, or magnitude of the command) and an amount of change in the parameter. At 316, the model generating module 300 generates a model of the plant based on the delay, the gain, and a time constant of the plant. The model generating module 300 takes in account disturbances associated with the plant including those arising from fluctuations in temperature and flow rate of the coolant supplied by the TCUs, disturbances from plasma heating, etc. to generate a highly accurate model.

Figure 4A:
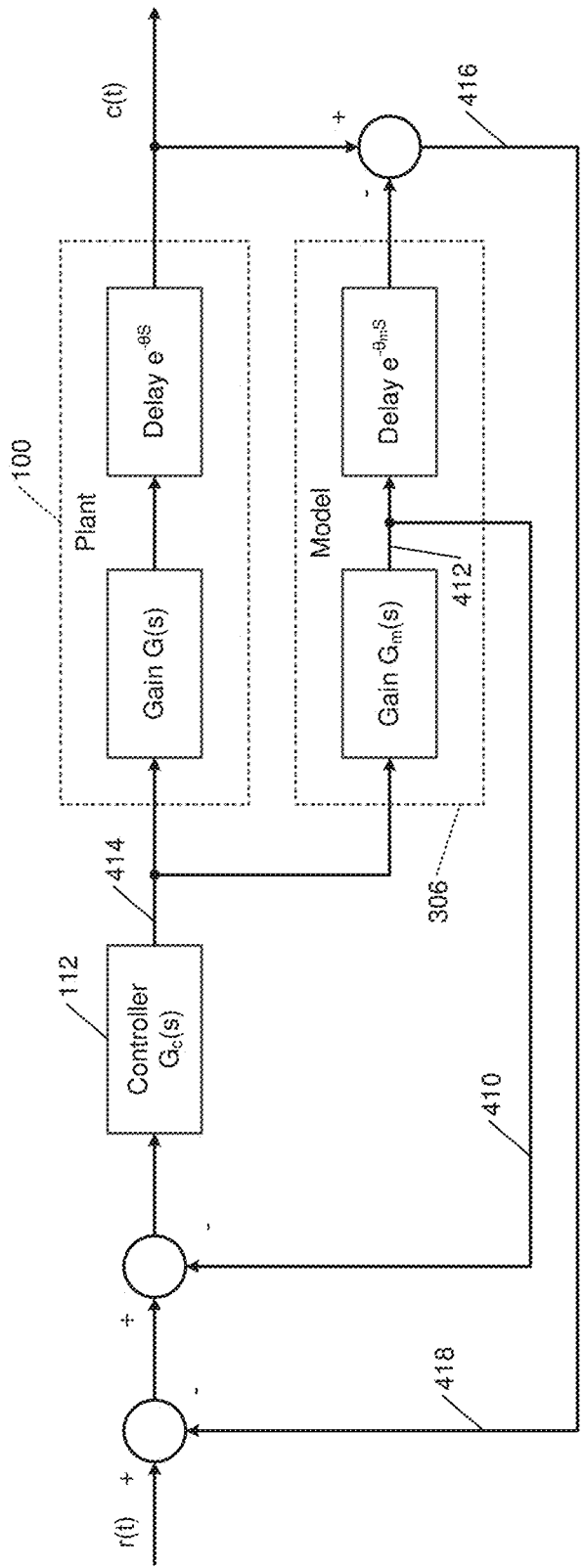
FIG. 4A shows an example of the controller that uses the plant model and Smith predictor to control the plant of the system of FIG. 1.

FIG. 4A shows an example of the controller 112 using the plant model and the Smith predictor to control the plant of the system 100. For example, r(t) is a reference or set point of a plant parameter (e.g., the coolant supply temperature), $G_c(s)$ is the PID controller (i.e., the controller 112 with Smith predictor), and c(t) is a measurement of the plant parameter (e.g., the coolant supply temperature). The Smith predictor uses the model $G_m(s)$ and $e^{-\theta_m s}$ to predict a delay-free response c(t) of the process. The controller 112 compares this prediction with a desired set point r(t) to determine any adjustments that may be needed.

G(s) and $e^{-\theta s}$ constitute a coolant supply temperature plant given by the following equation:

$$\text{Plant} = \frac{k}{Ts+1} e^{-\theta s} \quad (1)$$

where k is a gain, θ is a time delay, and T is a time constant of the plant.

$G_m(s)$ and $e^{-\theta_m s}$ constitute a coolant supply temperature plant estimation model given by the following equation:

$$\text{Model} = \frac{k_m}{T_m s+1} e^{-\theta_m s} \quad (2)$$

where $k_m$ is a gain, $\theta_m$ is a time delay, and $T_m$ is a time constant of the model.

An inner loop 410 uses the process model without the delay to predict an output 412 that is fed back to the controller 112 to generate a control signal 414 so that the process output will track the set point r(t). Since the inner loop 410 does not include the delay, the controller gain can be selected to be high to achieve fast and well-damped set point responses. The effects of any unmeasurable disturbance and small modeling errors are corrected by feeding back a predictor error 416 through an outer loop 418.

It should be noted that the highly accurate plant model generated by the controller 112 as described above increases the efficacy of the Smith predictor. Further, the accuracy of the plant model is independent of (i.e., distinct from) the order of the equation (1). In other words, the accuracy of the plant model is not related to (i.e., not proportional to) the order of the equation (1). Thus, the emphasis of the present disclosure is on generating a highly accurate plant model according to the present disclosure and then using the Smith predictor with the plant model to control the plant.

Figure 4B:
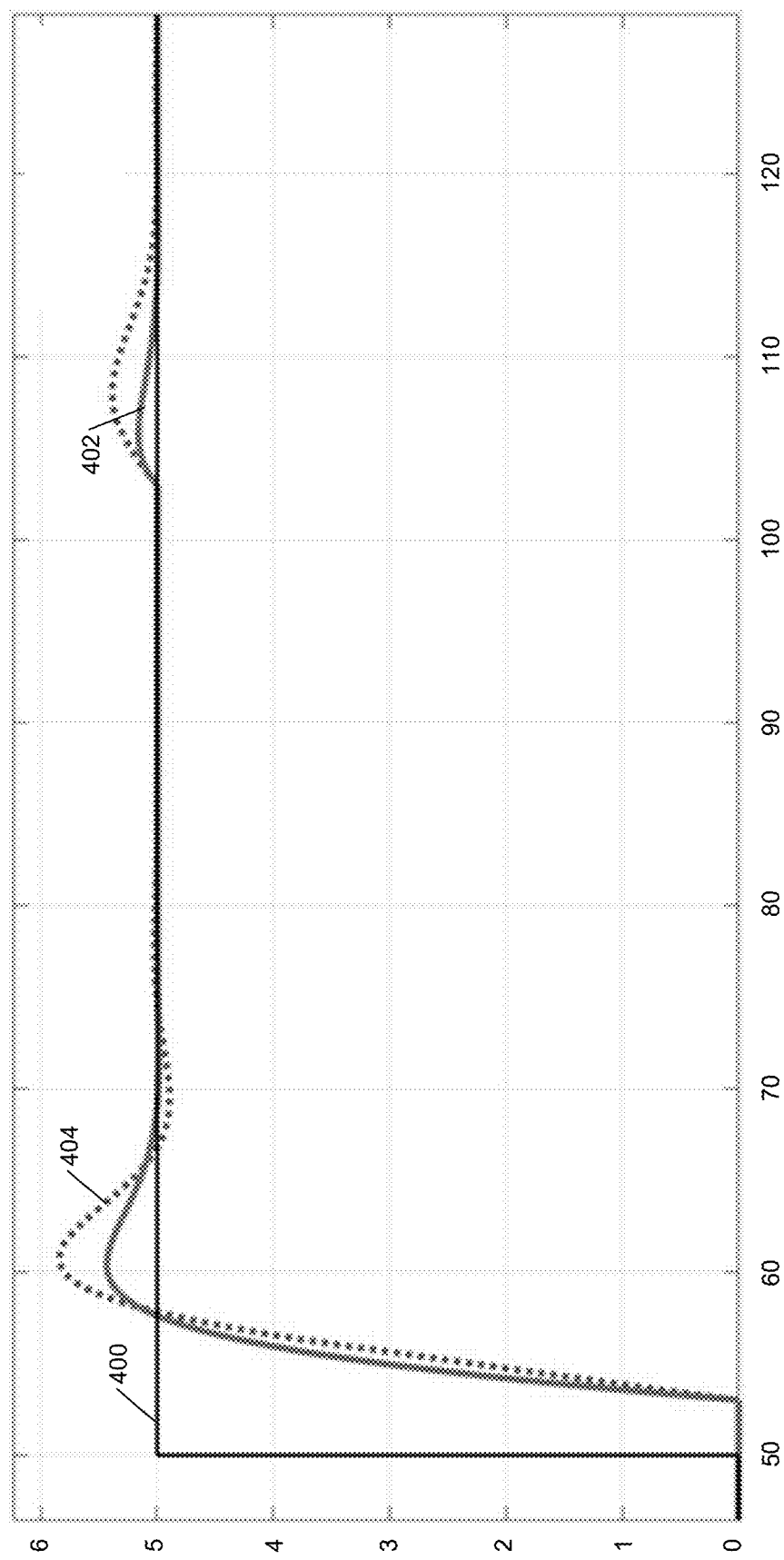
FIG. 4B shows a response of a plant parameter of the system of FIG. 1 when the system is controlled with and without using the plant model and Smith predictor.

FIG. 4B shows a step response 400 for a plant parameter (e.g., the coolant supply temperature) of the system 100 as a reference. FIG. 4B shows that using the model based Smith predictor control significantly improves the plant parameter response (e.g., the coolant supply temperature response). Specifically, the overshoot and rise time for the plant parameter are decreased when the model based Smith predictor control is used as shown at 402 as compared to the overshoot and rise time without using the model based Smith predictor control as shown at 404.

Figure 5:
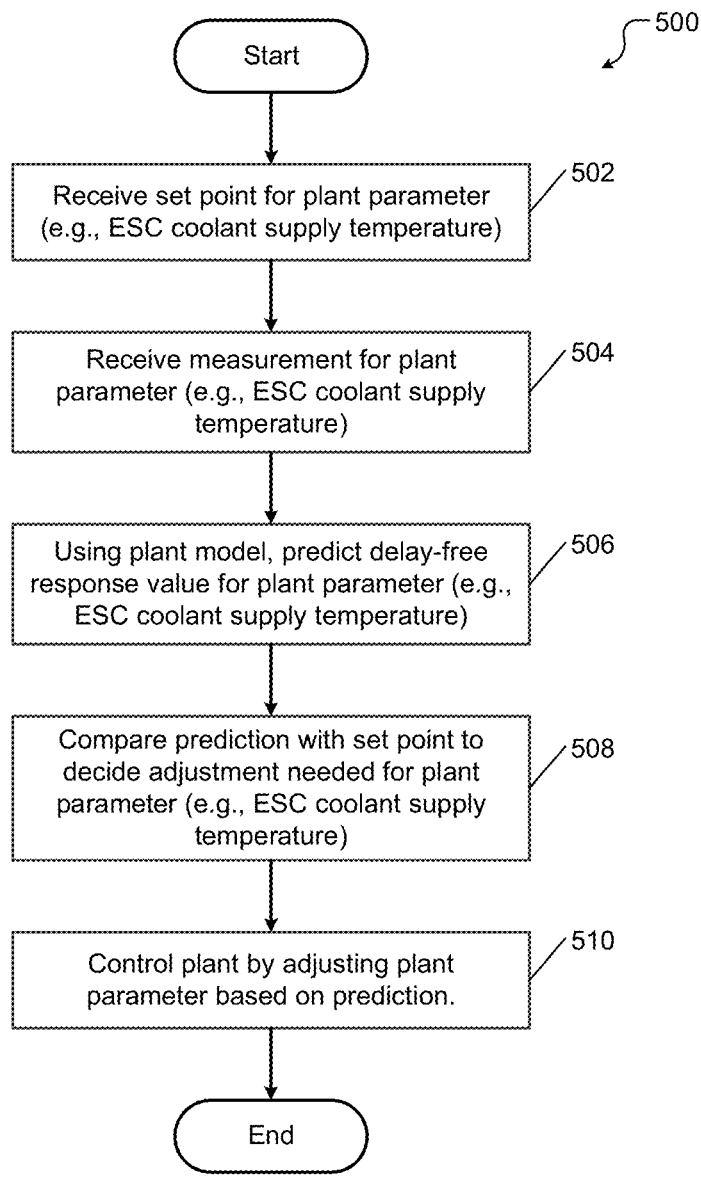
FIG. 5 shows a flowchart of a method for controlling the plant of the system of FIG. 1 using the plant model and Smith predictor.

FIG. 5 shows a method 500 executed by the controller 112 shown in FIG. 4A. At 502, the controller 112 receives a set point for a plant parameter (e.g., coolant supply temperature). At 504, the controller 112 receives a measurement for the plant parameter (e.g., coolant supply temperature from the temperature sensor 154). At 506, using the plant model for the plant parameter, Smith predictor used by the controller 112 predicts a delay-free response value for the plant parameter. At 508, the controller 112 compares the prediction with the set point to determine adjustment needed for the plant parameter to decrease overshoot and rise time of the plant parameter while effecting a change in the plant parameter according to the set point. At 510, the controller 112 controls the plant 100 by adjusting the plant parameter based on the prediction.

Using the model based Smith predictor control within the controller 112, the substrate temperature can be changed and maintained within the set point range without causing overshoots and an increase in rise time due to the delays associated with various plant elements (e.g., valves, sensors, meters, etc.).

Similar procedure can be used to control any other plant parameter. Examples of other parameters include but are not limited to temperature of the coolant returned from the substrate support assembly, flow rate of the coolant supplied to the substrate support assembly, and flow rate of the coolant returned from the substrate support assembly. Further, the above methodology can be extended to other plants having long delays. Furthermore, the teachings of the present disclosure can be extended to higher order models than those shown in equations 1 and 2 above.

In general, the teachings of the present disclosure can be used to control any parameter of any process associated with a substrate processing chamber that involves long time delays. For example, a substrate processing system may include one or more processing chambers (also called process modules) to perform deposition, etching, and/or other treatment of substrates such as semiconductor wafers. During processing, a substrate is arranged on a substrate support in a processing chamber of the substrate processing system. During deposition, gas mixtures including one or more precursors are introduced into the processing chamber, and plasma may be struck to activate chemical reactions. During etching, gas mixtures including etch gases are introduced, and plasma may be struck to activate chemical reactions. A computer-controlled robot typically transfers semiconductor substrates from one processing chamber to another in a sequence in which the semiconductor substrates are to be processed. Many processes are performed in a controlled manner during deposition, etching, and other treatment of substrates in the processing chambers (e.g., see examples described with reference to FIGS. 6 and 7 below). The teachings of the present disclosure can be used to control any parameter of these processes in a substrate processing including at least one processing chamber.

FIGS. 6 and 7 show two examples of substrate processing systems comprising substrate processing chambers, heating and cooling systems, a gas delivery system, a showerhead system, a plasma generation system, a purging system, and so on. These systems perform respective processes, which are controlled by controlling one or more parameters associated with these processes. The control of some of these parameters may be affected by long time delays and disturbances that are specific to the substrate processing systems. The teachings of the present disclosure can be used to control these parameters of these processes.

FIG. 6 shows an example of a substrate processing system 600. While the example is described in the context of plasma enhanced chemical vapor deposition (PECVD), the teachings of the present disclosure may be applied to other substrate processing systems such as atomic layer deposition (ALD), PEALD, CVD, or other process. The system 600 includes a processing chamber 622 that encloses other components of the system 600 and contains RF plasma (if used). The system 600 includes an upper electrode 624 and an electrostatic chuck (ESC) 626 or other substrate support. During operation, a substrate 628 is arranged on the ESC 626.

For example, the upper electrode 624 may include a gas distribution device 629 such as a showerhead that introduces and distributes process gases. The gas distribution device 629 may include a stem portion including one end connected to a top surface of the processing chamber. A base portion is generally cylindrical and extends radially outwardly from an opposite end of the stem portion at a location that is spaced from the top surface of the processing chamber. A substrate-facing surface or faceplate of the base portion of the showerhead includes a plurality of holes through which vaporized precursor, process gas, or purge gas flows. Alternately, the upper electrode 624 may include a conducting plate, and the process gases may be introduced in another manner.

The ESC 626 includes a baseplate 630 that acts as a lower electrode. The baseplate 630 supports a heating plate 632, which may correspond to a ceramic multi-zone heating plate. A thermal resistance layer 634 may be arranged between the heating plate 632 and the baseplate 630. The baseplate 630 may include one or more channels 636 for flowing coolant through the baseplate 630.

If plasma is used, an RF generating system 640 generates and outputs an RF voltage to one of the upper electrode 624 and the lower electrode (e.g., the baseplate 630 of the ESC 626). The other one of the upper electrode 624 and the baseplate 630 may be DC grounded, AC grounded, or floating. For example only, the RF generating system 640 may include an RF generator 642 that generates RF power that is fed by a matching and distribution network 644 to the upper electrode 624 or the baseplate 630. In other examples, the plasma may be generated inductively or remotely.

A gas delivery system 650 includes one or more gas sources 652-1, 652-2, . . . , and 652-N (collectively gas sources 652), where N is an integer greater than zero. The gas sources 652 are connected by valves 654-1, 654-2, . . . , and 654-N (collectively valves 654) and mass flow controllers 656-1, 656-2, . . . , and 656-N (collectively mass flow controllers 656) to a manifold 660. A vapor delivery system 661 supplies vaporized precursor to the manifold 660 or another manifold (not shown) that is connected to the processing chamber 622. An output of the manifold 660 is fed to the processing chamber 622.

A temperature controller 663 may be connected to a plurality of thermal control elements (TCEs) 664 arranged in the heating plate 632. The temperature controller 663 may be used to control the plurality of TCEs 664 to control a temperature of the ESC 626 and the substrate 628. The temperature controller 663 may communicate with a coolant assembly 666 to control coolant flow through the channels 636. For example, the coolant assembly 666 may include a coolant pump, a reservoir, and one or more temperature sensors. The temperature controller 663 operates the coolant assembly 666 to selectively flow the coolant through the channels 636 to cool the ESC 626. For example, the coolant assembly may be similar to the system 100 shown in FIG. 1.

A valve 670 and pump 672 form a purging system that may be used to evacuate reactants from the processing chamber 622. A system controller 680 may be used to control components of the system 600. For example, the system controller 680 can be similar to the controller 112 and can be used to control the processes performed by the components of the system 600 (e.g., the processing chamber, the heating and cooling system, gas delivery system, a showerhead system, plasma generation system, purging system, etc.). The system controller 680 controls the processes performed by these systems by controlling one or more parameters associated with these processes as described above with reference to the controller 112. The control of some of these parameters may be affected by long time delays and disturbances specific to the system 600. The teachings of the present disclosure (e.g., those described above with reference to the controller 112) can be used to control these parameters of these processes.

FIG. 7 shows another example of a substrate processing system 700 comprising a processing chamber for etching a layer of a substrate. While a specific processing chamber is shown and described, the teachings of the present disclosure may be applied to other substrate processing apparatuses.

The substrate processing chamber of the system 700 includes a lower chamber region 702 and an upper chamber region 704. The lower chamber region 702 is defined by chamber sidewall surfaces 708, a chamber bottom surface 710, and a lower surface of a gas distribution device 714.

The upper chamber region 704 is defined by an upper surface of the gas distribution device 714 and an inner surface of a dome 718. In some examples, the dome 718 rests on a first annular support 721. In some examples, the first annular support 721 includes one or more spaced holes 723 for delivering process gas to the upper chamber region 704. In some examples, the process gas is delivered by the one or more spaced holes 723 in an upward direction at an acute angle relative to a plane including the gas distribution device 714, although other angles/directions may be used. In some examples, a gas flow channel 734 in the first annular support 721 supplies gas to the one or more spaced holes 723.

The first annular support 721 may rest on a second annular support 725 that defines one or more spaced holes 727 for delivering process gas from a gas flow channel 729 to the lower chamber region 702. In some examples, holes 731 in the gas distribution device 714 align with the holes 727. In other examples, the gas distribution device 714 has a smaller diameter, and the holes 731 are not needed. In some examples, the process gas is delivered by the one or more spaced holes 727 in a downward direction towards a substrate 726 at an acute angle relative to the plane including the gas distribution device 714, although other angles/directions may be used.

In other examples, the upper chamber region 704 is cylindrical with a flat top surface and one or more flat inductive coils may be used. In still other examples, a single chamber may be used with a spacer located between a showerhead and the substrate support.

A substrate support 722 is arranged in the lower chamber region 704. In some examples, the substrate support 722 includes an electrostatic chuck (ESC), although other types of substrate supports can be used. The substrate 726 is arranged on an upper surface of the substrate support 722 during etching. In some examples, a temperature of the substrate 726 may be controlled by a heater plate 730, an optional cooling plate with fluid channels, and one or more sensors (not shown), although any other suitable substrate support temperature control system may be used. For example, when used, the optional cooling plate with fluid channels may be further coupled to a cooling system similar to the system 100 shown in FIG. 1.

In some examples, the gas distribution device 714 includes a showerhead (for example, a plate 728 having a plurality of spaced holes 731). The plurality of spaced holes 731 extend from the upper surface of the plate 728 to the lower surface of the plate 728. In some examples, the spaced holes 731 have a diameter in a range from 0.4" to 0.75" and the showerhead is made of a conducting material such as aluminum or a non-conductive material such as ceramic with an embedded electrode made of a conducting material.

One or more inductive coils 740 are arranged around an outer portion of the dome 718. When energized, the one or more inductive coils 740 create an electromagnetic field inside of the dome 718. In some examples, an upper coil and a lower coil are used. A gas injector 742 injects one or more gas mixtures from a gas delivery system 750-1.

In some examples, the gas delivery system 750-1 includes one or more gas sources 752, one or more valves 754, one or more mass flow controllers (MFCs) 756, and a mixing manifold 758, although other types of gas delivery systems may be used. A gas splitter (not shown) may be used to vary flow rates of a gas mixture. Another gas delivery system 750-2 may be used to supply an etch gas or an etch gas mixture to the gas flow channels 729 and/or 734 (in addition to or instead of etch gas from the gas injector 742).

In some examples, the gas injector 742 includes a center injection location that directs gas in a downward direction and one or more side injection locations that inject gas at an angle with respect to the downward direction. In some examples, the gas delivery system 750-1 delivers a first portion of the gas mixture at a first flow rate to the center injection location and a second portion of the gas mixture at a second flow rate to the side injection location(s) of the gas injector 742. In other examples, different gas mixtures are delivered by the gas injector 742. In some examples, the gas delivery system 750-1 delivers tuning gas to the gas flow channels 729 and 734 and/or to other locations in the processing chamber as will be described below.

A plasma generator 770 may be used to generate RF power that is output to the one or more inductive coils 740. Plasma 790 is generated in the upper chamber region 704. In some examples, the plasma generator 770 includes an RF generator 772 and a matching network 774. The matching network 774 matches an impedance of the RF generator 772 to the impedance of the one or more inductive coils 740. In some examples, the gas distribution device 714 is connected to a reference potential such as ground. A valve 778 and a pump 780 form a purging system that may be used to control pressure inside the lower and upper chamber regions 702, 704 and to evacuate reactants.

A controller 776 communicates with the gas delivery systems 750-1 and 750-2, the valve 778, the pump 780, and the plasma generator 770 to control flow of process gas, purge gas, RF plasma and chamber pressure. In some examples, plasma is sustained inside the dome 718 by the one or more inductive coils 740. One or more gas mixtures are introduced from a top portion of the chamber using the gas injector 742 (and/or holes 723), and plasma is confined within the dome 718 using the gas distribution device 714.

Confining the plasma in the dome 718 allows volume recombination of plasma species and effusing desired etchant species through the gas distribution device 714. In some examples, there is no RF bias applied to the substrate 726. As a result, there is no active sheath on the substrate 726 and ions are not hitting the substrate with any finite energy. Some amount of ions will diffuse out of the plasma region through the gas distribution device 714. However, the amount of plasma that diffuses is an order of magnitude lower than the plasma located inside the dome 718. Most ions in the plasma are lost by volume recombination at high pressures. Surface recombination loss at the upper surface of the gas distribution device 714 also lowers ion density below the gas distribution device 714.

In other examples, an RF bias generator 784 is provided and includes an RF generator 786 and a matching network 788. The RF bias can be used to create plasma between the gas distribution device 714 and the substrate support or to create a self-bias on the substrate 726 to attract ions. The controller 776 may be used to control the RF bias.

In general, the controller 776 can be similar to the controller 112 and can be used to control all of the components of the system 700. For example, the controller 776 can be used to control processes performed the components of the system 700 (e.g., the processing chamber, the heating and cooling system, gas delivery system, a showerhead system, plasma generation system, purging system, etc.). The controller 776 controls the processes performed by these systems by controlling one or more parameters associated with these processes as described above with reference to the controller 112. The control of some of these parameters may be affected by long time delays and disturbances specific to the system 700. The teachings of the present disclosure (e.g., those described above with reference to the controller 112) can be used to control these parameters of these processes.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium.

The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

In this application, apparatus elements described as having particular attributes or performing particular operations are specifically configured to have those particular attributes and perform those particular operations. Specifically, a description of an element to perform an action means that the element is configured to perform the action. The configuration of an element may include programming of the element, such as by encoding instructions on a non-transitory, tangible computer-readable medium associated with the element.

The apparatuses and methods described in this application may be partially or fully implemented by a special purpose computer created by configuring a general purpose computer to execute one or more particular functions embodied in computer programs. The functional blocks, flowchart components, and other elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation) (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C #, Objective-C, Swift, Haskell, Go, SQL, R, Lisp, Java®, Fortran, Perl, Pascal, Curl, OCaml, Javascript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

What is claimed is:

1. A system for controlling a parameter of a plant associated with a substrate processing chamber, the system comprising:
   a measuring circuit to measure a response of the plant associated with the substrate processing chamber when the parameter of the plant is changed;
   a model generating circuit to:
      determine a delay and a gain of the plant based on the response, the delay indicating time taken for the parameter to change after the plant receives a command to change the parameter, and the gain indicating a relationship between the command and an amount of change in the parameter caused by the command; and
      generate a model of the plant based on the delay, the gain, and a time constant of the plant; and
   a predicting circuit to:
      receive a set point for the parameter and a measurement of the parameter,
      generate a value of a prediction of the parameter based on the set point for the parameter and the measurement of the parameter using the model, wherein the value of the prediction of the parameter does not include the delay,
      compare the value of the prediction of the parameter with the set point to generate a control signal, and
      control the parameter of the plant based on the control signal.

2. The system of claim 1 wherein the value of the prediction of the parameter decreases at least one of an overshoot and a rise time of the parameter in response to a change in the set point.

3. The system of claim 1 wherein the substrate processing chamber includes a substrate support assembly supporting a substrate, and wherein the plant controls an operation of the substrate support assembly including controlling a temperature of the substrate.

4. The system of claim 3 wherein the plant comprises:
   first and second sources to supply a fluid at different temperatures;
   first and second three-way proportional valves to receive the fluid from the first and second sources and to mix portions of the received fluid to supply the fluid to the substrate support assembly at a first temperature and a first flow rate; and
   a third three-way proportional valve to receive the fluid from the substrate support assembly at a second temperature and a second flow rate and to return the fluid received from the substrate support assembly to the first and second sources,
   wherein the predicting circuit controls the first, second, and third three-way proportional valves according to the control signal.

5. The system of claim 4 wherein the parameter includes at least one of the first temperature of the fluid supplied to the substrate support assembly, the second temperature of the fluid returned from the substrate support assembly, the first flow rate of the fluid supplied to the substrate support assembly, and the second flow rate of the fluid returned from the substrate support assembly.

6. The system of claim 4 wherein the predicting circuit controls a temperature of the substrate based on the fluid supplied to the substrate support assembly according to the control signal.

7. The system of claim 4 wherein the measuring circuit comprises:
a temperature sensor associated with a supply line that supplies the fluid from the first and second three-way proportional valves to the substrate support assembly; and
a flow meter associated with the supply line,
wherein the model generating circuit generates the model of the plant based on data received from the temperature sensor and the flow meter.

8. The system of claim 4 wherein the measuring circuit comprises:
a temperature sensor associated with a return line that returns the fluid from the substrate support assembly to the third three-way proportional valve; and
a flow meter associated with the return line,
wherein the model generating circuit generates the model of the plant based on data received from the temperature sensor and the flow meter.

9. The system of claim 4 wherein:
the first and second sources include level sensors to sense fluid levels of the first and second sources; and
the predicting circuit controls the third three-way proportional valve based on the fluid levels.

10. The system of claim 4 wherein the third three-way proportional valve divides the fluid received from the substrate support assembly between the first and second sources to maintain fluid levels of the first and second sources between first and second thresholds.

11. A method for controlling a parameter of a plant associated with a substrate processing chamber, the method comprising:
measuring a response of the plant associated with the substrate processing chamber when the parameter of the plant is changed;
determining a delay and a gain of the plant based on the response, the delay indicating time taken for the parameter to change after the plant receives a command to change the parameter, and the gain indicating a relationship between the command and an amount of change in the parameter caused by the command;
generating a model of the plant based on the delay, the gain, and a time constant of the plant;
receiving a set point for the parameter and a measurement of the parameter;
generating a value of a prediction of the parameter based on the set point for the parameter and the measurement of the parameter using the model, wherein the value of the prediction of the parameter does not include the delay;
comparing the value of the prediction of the parameter with the set point to generate a control signal; and
controlling the parameter of the plant based on the control signal.

12. The method of claim 11 wherein the value of the prediction of the parameter decreases at least one of an overshoot and a rise time of the parameter in response to a change in the set point.

13. The method of claim 11 wherein the substrate processing chamber includes a substrate support assembly supporting a substrate, the method further comprising controlling an operation of the substrate support assembly including controlling a temperature of the substrate.

14. The method of claim 13 further comprising:
receiving, at first and second three-way proportional valves, a fluid from first and second sources;
mixing, using the first and second three-way proportional valves, portions of the fluid received from the first and second sources;
supplying the mixed portions of the fluid having a first temperature to the substrate support assembly at a first flow rate;
receiving, at a third three-way proportional valve, fluid having at a second temperature from the substrate support assembly at a second flow rate;
returning, using the third three-way proportional valve, the fluid received from the substrate support assembly to the first and second sources; and
controlling the first, second, and third three-way proportional valves according to the control signal.

15. The method of claim 14 wherein the parameter includes at least one of the first temperature of the fluid supplied to the substrate support assembly, the second temperature of the fluid returned from the substrate support assembly, the first flow rate of the fluid supplied to the substrate support assembly, and the second flow rate of the fluid returned from the substrate support assembly.

16. The method of claim 14 further comprising controlling a temperature of the substrate based on the fluid supplied to the substrate support assembly according to the control signal.

17. The method of claim 14 further comprising:
sensing, using a temperature sensor, a temperature of the mixed portions of the fluid being supplied from the first and second three-way proportional valves to the substrate support assembly;
measuring, using a flow meter, a flow rate of the mixed portions of the fluid flowing to the substrate support assembly; and
generating the model of the plant based on the sensed temperature and the measured flow rate.

18. The method of claim 14 further comprising:
sensing, using a temperature sensor, a temperature of the fluid returned from the substrate support assembly to the third three-way proportional valve;
measuring, using a flow meter, a flow rate of the fluid returned from the substrate support assembly to the third three-way proportional valve; and
generating the model of the plant based on the sensed temperature and the measured flow rate.

19. The method of claim 14 further comprising:
sensing, using level sensors, fluid levels of the first and second sources; and
controlling the third three-way proportional valve based on the fluid levels.

20. The method of claim 14 further comprising dividing the fluid received from the substrate support assembly between the first and second sources to maintain fluid levels of the first and second sources between first and second thresholds.

21. A system comprising:
a plant to control a parameter of a substrate processing system based on a set point for the parameter;
a controller to output a command to the plant to change a value of the parameter in response to a change in the set point for the parameter;
a model of the plant to:
output a first value of the parameter based on a gain of the plant and a delay of the plant; and
output a second value of the parameter based on the gain of the plant and not based on the delay of the plant;

wherein the delay indicates time taken for the parameter to change after the plant receives the command to change the parameter; and wherein the gain indicates a relationship between the command and an amount of change in the parameter caused by the command;

a first combiner to combine an output of the plant and the first value of the parameter output by the model and to generate a first combined output;

a second combiner to combine the first combined output and the set point and to generate a second combined output; and a third combiner to combine the second combined output and the second value of the parameter output by the model and to generate a third combined output, wherein the controller outputs the command based on the third combined output.

* * * * *